(12) United States Patent
Hernes

(10) Patent No.: US 10,153,752 B2
(45) Date of Patent: Dec. 11, 2018

(54) RELAXATION OSCILLATOR CIRCUIT FOR LOW FREQUENCY AND LOW POWER DISSIPATION

(71) Applicant: Disruptive Technologies Research AS, Blomsterdalen (NO)

(72) Inventor: Bjørnar Hernes, Trondheim (NO)

(73) Assignee: DISRUPTIVE TECHNOLOGIES RESEARCH AS, Blomsterdalen (NO)

( * ) Notice: Subject to any disclaimer, the term of this patent is extended or adjusted under 35 U.S.C. 154(b) by 176 days.

(21) Appl. No.: 15/400,588

(22) Filed: Jan. 6, 2017

(65) Prior Publication Data
US 2017/0194944 A1    Jul. 6, 2017

Related U.S. Application Data

(60) Provisional application No. 62/275,368, filed on Jan. 6, 2016.

(51) Int. Cl.
| | |
|---|---|
| *H03K 3/012* | (2006.01) |
| *H03K 3/356* | (2006.01) |
| *H03K 5/1534* | (2006.01) |
| *H03B 5/24* | (2006.01) |
| *H03K 3/3565* | (2006.01) |
| *H03B 5/20* | (2006.01) |
| *H03K 3/0231* | (2006.01) |
| *H03K 3/354* | (2006.01) |

(52) U.S. Cl.
CPC ............. *H03K 3/012* (2013.01); *H03B 5/20* (2013.01); *H03B 5/24* (2013.01); *H03K 3/0231* (2013.01); *H03K 3/354* (2013.01); *H03K 3/3565* (2013.01); *H03K 3/356104* (2013.01); *H03K 5/1534* (2013.01)

(58) Field of Classification Search
CPC ............. H03K 3/012; H03K 3/356104; H03K 5/1534; H03K 3/3565; H03K 3/0231; H03K 3/35433; H03B 5/20; H03B 5/24
USPC ..... 331/16, 67, 111, 143; 327/156, 158, 159
See application file for complete search history.

(56) References Cited

U.S. PATENT DOCUMENTS

| | | | | |
|---|---|---|---|---|
| 5,302,920 A | * | 4/1994 | Bitting | ................. H03K 3/0315 327/101 |
| 6,028,488 A | * | 2/2000 | Landman | ................. H03K 3/03 327/156 |

(Continued)

*Primary Examiner* — Arnold Kinkead
(74) *Attorney, Agent, or Firm* — Miller, Matthias & Hull LLP

(57) ABSTRACT

A relaxation oscillator circuit includes a current mirror configured to receive the input current from the and generate a plurality of starved currents, a Schmitt trigger configured to be current starved by a first starved current of the plurality of starved currents and a plurality of inverters configured to receive a Schmitt trigger output signal and generate an output clock signal, the inverters including a plurality of current starved inverters that are current starved by a second starved current of the plurality of starved currents, the plurality of current starved inverters receiving the Schmitt trigger output signal and generating a first inverter output signal, upon which an output clock signal is based. The relaxation includes a capacitor configured to charge or discharge in response to the output clock signal and a switching module configured to provide current from the current source based on the output clock signal.

20 Claims, 5 Drawing Sheets

(56) References Cited

U.S. PATENT DOCUMENTS

| | | | | |
|---|---|---|---|---|
| 6,825,735 B2* | 11/2004 | Chung | ................... | H03B 5/04 |
| | | | | 331/135 |
| 7,750,744 B2* | 7/2010 | Clements | .............. | H03L 7/0995 |
| | | | | 331/16 |
| 9,671,284 B1* | 6/2017 | Dandin | ............. | H01L 31/02027 |
| 2017/0194950 A1* | 7/2017 | Hernes | ................... | H03K 3/012 |

* cited by examiner

RELAXATION OSCILLATOR CIRCUIT FOR LOW FREQUENCY AND LOW POWER DISSIPATION

TECHNICAL FIELD

The present disclosure relates generally to readout circuitry, and more particularly, to relaxation oscillator circuitry for use as part of, or in conjunction with, readout circuitry.

BACKGROUND

In certain electrical circuit applications, such as those circuits utilized in wireless sensors for Internet of Things (IOT) applications, long battery life for such applications, while maintaining a small sized component, is often required. Such requirements may necessitate that the circuitry is designed to have very low power dissipation. Sensor readout circuitry, ideally, is completely off when such circuitry is not polling sensors, while such circuitry must wake up in the event of desired sensor data acquisition.

In order for such sensor readout circuitry to know when to wake up from its turned-off state, a low frequency oscillator circuit may be utilized to trigger a sensor readout event. Such oscillators may be the only component of the electrical circuit, or the readout component thereof, which is active at all times and, therefore, such circuits are desired to be designed to have minimal power dissipation.

Prior art oscillators have been designed in the past for implementation at low frequency and low power. For example, a low power, low frequency oscillator is exemplified by the circuit 10 of FIG. 1. The circuit 10 includes one or more current sources 11, exemplified by the $I_{RN}$ source and the $I_{RP}$ sources, as shown, a switch module 12 having switches S1 and S2, a capacitor 14 having a capacitance C, a Schmitt trigger 16 designated as P0, and an array 18 of inverters each designated P1, P2, and P3. A reference current either to or from the current source(s) 11 is constantly either charging or discharging the capacitor 14, in response to current flow changes designated by the switching module 12. For example, consider the voltage at the node TOP ($V_{TOP}$) is below a lower threshold voltage of the Schmitt trigger 16, designated as $V_{ST,LOW}$. In such examples, the output signal of the Schmitt trigger 16, CK0, goes high and the edge from CK0 propagates through the array 18, from P1 to P2 and to P3, to output the CK, clocking signal. In such examples, CK is low and the switching module 12 turns off S2 and turns on S1, which causes the current source 11 to charge C of the capacitor 14 upwards. Alternatively, if $V_{TOP}$ rises above an upper voltage threshold for the Schmitt trigger, $V_{ST,HIGH}$, output of the Schmitt trigger 16, CK0, will go low and, thusly, when inverted by the array 18 with the signal edges propagated throughout, CK will output high to the switching module 12. In such examples, S1 turns off and S2 turns on, which causes the capacitor 14 to discharge C downwards. This oscillation of the clocking signals and charging/discharging of the capacitor 14 repeats so long as current is supplied to the circuit 10. Graphical depiction of the changes and relationships between $V_{TOP}$, CK0, CK1, and CK is illustrated, graphically, in the depiction of signal voltage versus time in FIG. 2.

When utilizing relaxation oscillators, such as the prior art circuit 10, if the clock frequency is in the range of 1 to 100 Hertz (Hz), then the clock period is in the range of 10 milliseconds (ms) to 1000 ms. Further, the voltage on the TOP node has a rise-to-fall time of up to 500 ms. Due to such slow rise-to-fall timing, the Schmitt trigger 16 may be close to its threshold voltages, either high or low, for long periods of time. In such periods of time, the Schmitt trigger 16 may draw a short current from the current supply 11 to ground, which results in excess power dissipation from the circuit 10. Due to similarly slow clock edges produced by each of the array 18 of inverters, the power dissipation from such inverters may be similarly restrictive. Accordingly, alternative relaxation oscillator circuits, which minimize power dissipation, while operating at low frequency, are desired.

The present disclosure is directed at addressing one or more of the deficiencies and disadvantages set forth above. However, it should be appreciated that the solution of any particular problem is not a limitation on the scope of this disclosure or of the attached claims except to the extent expressly noted.

SUMMARY OF THE DISCLOSURE

In one aspect of the present disclosure, a relaxation oscillator circuit is provided. The relaxation oscillator circuit may include a current source configured to provide an input current. The relaxation oscillator circuit may further include a current mirror configured to receive the input current from the current source and generate a plurality of starved currents. The relaxation oscillator may further include a Schmitt trigger configured to be current starved by a first starved current of the plurality of starved currents and generate a Schmitt trigger output signal in response to an oscillating voltage input, wherein the Schmitt trigger output signal oscillates from a high signal to a low signal, the high signal triggered when the oscillating input voltage is lower than a lower voltage threshold for the Schmitt trigger, and the low signal is triggered when the oscillating input voltage exceeds a high voltage threshold for the Schmitt trigger. The relaxation oscillator may further include a plurality of inverters configured to receive the Schmitt trigger output signal and generate an output clock signal based thereon, the plurality of inverters may include a plurality of current starved inverters that are current starved by a second starved current of the plurality of starved currents, the plurality of current starved inverters receiving the Schmitt trigger output signal and generating a first inverter output signal and one or more edge shaping inverters configured to further shape edges for the output clock signal and generate the output clock signal based, at least, on the first inverter output signal. The relaxation oscillator may further include a capacitor configured to charge or discharge in response to the output clock signal and a switching module configured to provide current from the current source to charge the capacitor when the output clock signal is low and discharge the capacitor when the output clock signal is high.

In another aspect of the present disclosure, another relaxation oscillator circuit is provided. The relaxation oscillator circuit may include a current digital-to-analog converter (DAC) configured to provide an input current, the current DAC being a configurable input current source and including a control block for setting a digital input for the current DAC. The relaxation oscillator circuit may further include a current mirror configured to receive the input current from the current source and generate a plurality of starved currents. The relaxation oscillator may further include a Schmitt trigger configured to be current starved by a first starved current of the plurality of starved currents and generate a Schmitt trigger output signal in response to an oscillating voltage input, wherein the Schmitt trigger output signal oscillates from a high signal to a low signal, the high signal triggered when the oscillating input voltage is lower than a lower voltage threshold for the Schmitt trigger, and the low signal is triggered when the oscillating input voltage exceeds a high voltage threshold for the Schmitt trigger. The relaxation oscillator may further include a plurality of inverters configured to receive the Schmitt trigger output signal and generate an output clock signal based thereon, the plurality of inverters may include a plurality of current starved inverters that are current starved by a second starved current of the plurality of starved currents, the plurality of current starved inverters receiving the Schmitt trigger output signal and generating a first inverter output signal and one or more edge shaping inverters configured to further shape edges for the output clock signal and generate the output clock signal based, at least, on the first inverter output signal. The relaxation oscillator may further include a capacitor configured to charge or discharge in response to the output clock signal and a switching module configured to provide current from the current source to charge the capacitor when the output clock signal is low and discharge the capacitor when the output clock signal is high.

In yet another aspect of the present disclosure, a relaxation oscillator circuit, for an Internet of Things (IOT) sensor, is provided. The relaxation oscillator circuit may include a current source configured to provide an input current. The relaxation oscillator circuit may further include a current mirror configured to receive the input current from the current source and generate a plurality of starved currents. The relaxation oscillator may further include a Schmitt trigger configured to be current starved by a first starved current of the plurality of starved currents and generate a Schmitt trigger output signal in response to an oscillating voltage input, wherein the Schmitt trigger output signal oscillates from a high signal to a low signal, the high signal triggered when the oscillating input voltage is lower than a lower voltage threshold for the Schmitt trigger, and the low signal is triggered when the oscillating input voltage exceeds a high voltage threshold for the Schmitt trigger. The relaxation oscillator may further include a plurality of inverters configured to receive the Schmitt trigger output signal and generate an output clock signal based thereon, the plurality of inverters may include a plurality of current starved inverters that are current starved by a second starved current of the plurality of starved currents, the plurality of current starved inverters receiving the Schmitt trigger output signal and generating a first inverter output signal, a final current starved inverter being current starved by a third starved current of the plurality of starved currents and configured to receive the first inverter output signal and generate a second inverter output signal based, at least, on the first inverter output signal, and one or more edge shaping inverters configured to further shape edges for the output clock signal and generate the output clock signal based, at least, on the second inverter output signal. The relaxation oscillator may further include a capacitor configured to charge or discharge in response to the output clock signal and a switching module configured to provide current from the current source to charge the capacitor when the output clock signal is low and discharge the capacitor when the output clock signal is high.

These and other aspects and features will be more readily understood when reading the following detailed description in conjunction with the accompanying drawings.

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Figure 3:
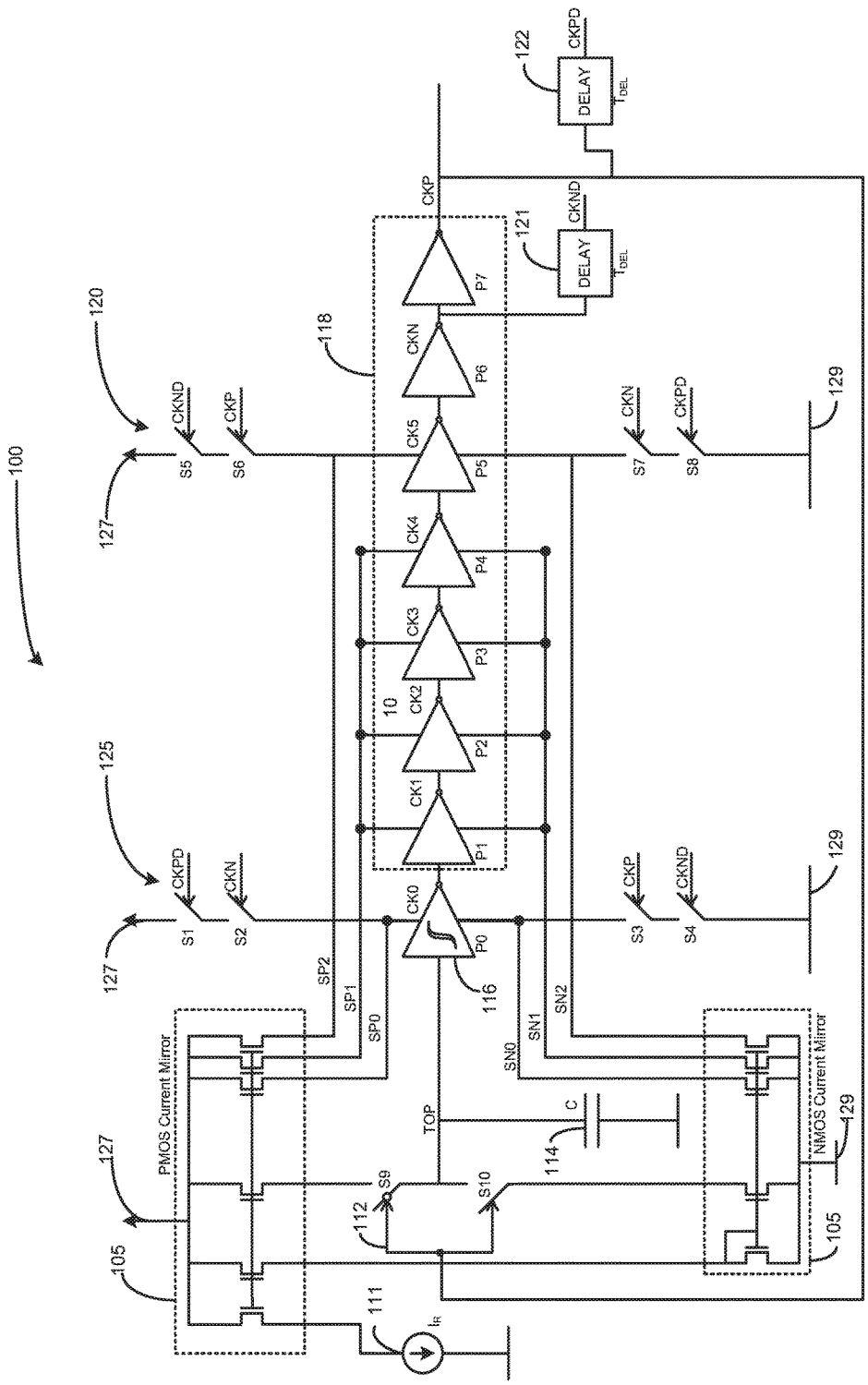
FIG. 3 is a schematic depiction of one exemplary relaxation oscillator device or circuitry of the present disclosure.

Referring to FIG. 3, an example circuit diagram for a relaxation oscillator 100 is shown. The relaxation oscillator 100 may be utilized in the context of a variety of electronics applications, such as, but not limited to, IOT sensors. In contrast to the prior art circuit 10, illustrated in FIG. 1 and discussed above, the relaxation oscillator 100 is configured to combat potential high short currents, that may be caused by long edge times in a Schmitt trigger 116 and/or one or more of a plurality of inverters 118. To combat such shorts due to long edge times, the Schmitt trigger 116 and one or more of the inverters 118 may be current starved. Current starving of the Schmitt trigger 116 and/or one or more of the inverters 118 may limit current shorting of such elements to the starved current and, thusly, may limit power dissipation in the relaxation oscillator 100, in comparison to prior art circuitry. Current starving of such elements may be achieved by utilizing a current mirror 105, as discussed in more detail below.

Current starving of the Schmitt trigger 116 and/or one or more inverters 118 may refer to a system of limiting current to supply terminals of the starved Schmitt trigger 116 and/or inverters 118 via the current mirror 105. A non-starved Schmitt trigger and/or inverter may, theoretically, draw as much current as it likes; however, the starved Schmitt trigger 116 and/or inverter(s) 118 are limited by the current mirror 105. When starved, such elements may be limited to current provided by the current mirror 105 and, thusly, limited in what current they can pull. The current starved Schmitt trigger 116 and one or more inverters 118 (e.g., inverters P1, P2, P3, P4, and P5) may limit a short current of such device to the value of the starved current provided to said device.

Figure 1:
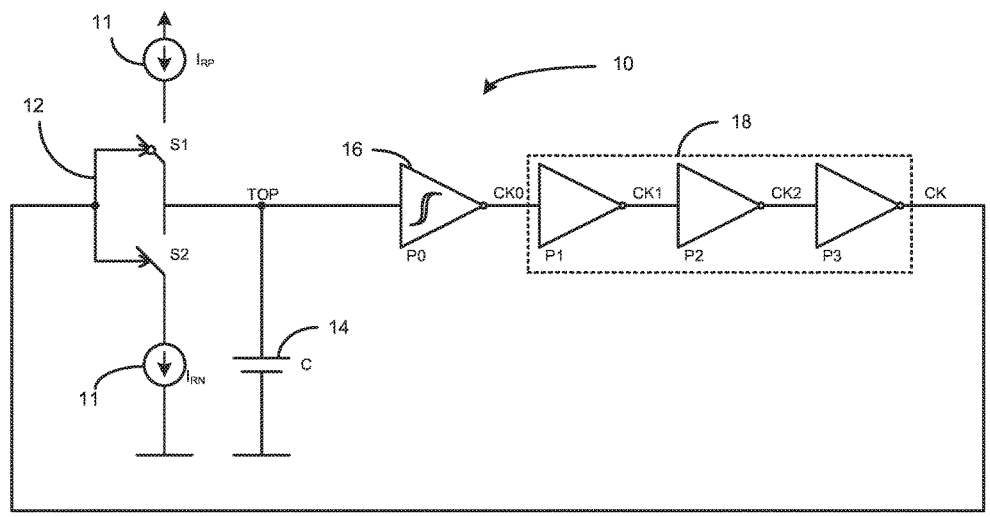
FIG. 1 is a schematic depiction of one exemplary prior art relaxation oscillator.
Figure 2:
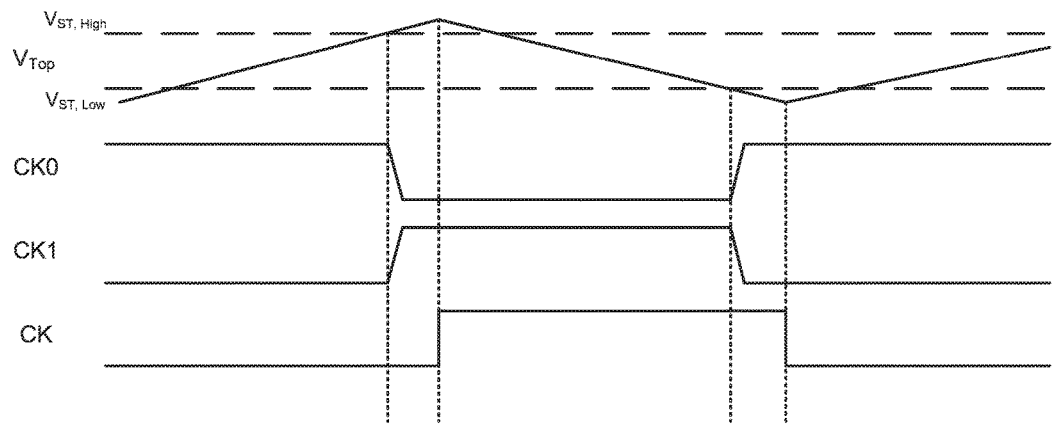
FIG. 2 is a diagrammatic view of one timing diagram of the prior art relaxation oscillator of FIG. 1.

In the instant example of the relaxation oscillator 100, the current mirror 105 comprises a PMOS current mirror connected to positive supply terminal 127 of the Schmitt trigger 116 and one or more of the inverters 118 and an NMOS current mirror connected to negative supply terminal 129 of the Schmitt trigger 116 and one or more of the inverters 118. However, other devices or configurations for current mirrors, as known in the art, may alternatively be used as the current mirror 105 and the invention is certainly not limited to the shown configuration. Accordingly, while FIG. 1 shows these current mirrors as being implemented using a plurality of MOSFET components, the current mirror 105 may be implemented in alternative configurations, without changing functionality of the relaxation oscillator 100.

In the example configuration of current starving for the Schmitt trigger 116 and some of the inverters 118, the Schmitt trigger is provided with a first starved current, via the current mirror 105, across nodes SP0 and SN0, inverters P1, P2, P3, and P4 of the inverters 118 are provided with a second starved current, via the current mirror 105, across nodes SP1 and SN1, and inverter P5 of the inverters 118 is provided with a third starved current across nodes SP2 and SN2. The inverters P1, P2, P3, and P4 share the same, second starved current source from the current mirror 105 because when CK0 (e.g., a Schmitt trigger output signal), output by the Schmitt trigger 116 to the inverter P1, has a rising edge, CK1, output by the inverter P1, goes down and, thusly, pulls the voltage of the SN1 node upwards. Then, at the output of the next inverter P2, the rising edge of CK2 then pulls voltage across the node SP1 downwards. The result of this is that supply voltage of inverters P1, P2, P3, and P4 is reduced and maintains symmetry at around half of the of the global supply voltage. The reduced supply voltage results in sharp clock edges for the signals CK1, CK2, CK3, and CK4 around the threshold of each's following inverter, which may shape the clock signals with fewer inverts than if the inverters P1, P2, P3, P4 had separate current sources.

However, in this example implementation, the last current starved inverter 118 in an array of inverters, in this case inverter P5 acting as a final current starved inverter, may be connected to its own individual starved current, the third starved current. If the last current starved inverter P5 were to share current starving with the prior inverters in the series, the voltages on notes SP1 and SN1 would be very close to the transition region voltage for the inverter P6, which is not current starved, such that when the clock edge arrived at CK5, it would generate a large short current in P6, which potentially could lead to increased power dissipation. Therefore, P5 is connected to its own starved current across nodes SP2 and SN2. Using this configuration, clock edges of the output signal CK5 are shaped enough that normal, non-starved inverters (e.g., inverter P6 and/or inverter P7) may be used to further buffer the output clock signal CKP.

Further, in some corner cases, for example when high supply voltage is provided to the relaxation oscillator 100, the current starved inverter P5 of the array 118 can still cause high short current in the following inverter P6, as previously explained. To prevent this from occurring, the inverter switching module 120 is added. The purpose of the inverter switching module 120 is to reset the supply voltage of the current starved inverter P5 to the relaxation oscillator 100 global supply terminals 127, 129 for a short period of time after a clock edge has passed through the inverter array 118. Right before a falling edge of CK4 arrives at the input of P5, the switches S5 and S7 of the inverter switching module 120 are closed and switches S6 and S8 are open, and inverter P5 works as a current starved inverter. When a falling edge arrives at the input of switch P5, the voltage on CK5 will rise to the voltage at node SP2, which is pulled downwards to supply CK5 with current. Inverter P6 is triggered and its output CKN goes down and the output CKP of P7 goes high. CKP high closes the switch S6, while switch S5 is already closed since CKND is still high. Node SP2 is now drawn to the global positive supply voltage of terminal 127 of the relaxation oscillator 100 and the voltage on CK5 follows, turning off any short current of inverter P6. Further, after a short delay $T_{DEL}$, CKND goes low and opens switch S5. During this sequence, first switch S7 opens by low CKN and second switch S8 closes due to high CKPD. Inverter P5 is now a current starved inverter again ready for the next clock edge. Right before a rising edge arrives at the input of inverter P5, the switches S6 and S8 of the inverter switching module 120 are closed and switches S5 and S7 are open, and P5 works as a current starved inverter. When a rising edge arrives at the input of inverter P5, the voltage on CK5 will fall to the voltage at SN2, which is pulled upwards to draw current out of CK5. Inverter P6 is triggered and its output CKN goes high and the output CKP of P7 goes low. CKN high closes the switch S7, while switch S8 is already closed by high on CKPD. Node SN2 is now drawn to the global ground terminal 129 of the relaxation oscillator 100 and the voltage on CK5 follows, turning off any short current of inverter P6. Further, after a short delay $T_{DEL}$, CKPD goes low and opens switch S8. During this sequence first switch S6 opens by low CKP and second switch S5 closes due to high CKND. Inverter P5 is now a current starved inverter again ready for the next clock edge.

Similarly, a Schmitt trigger switching module 125, having switches S1, S2, S3, and S4, may be utilized to further protect the relaxation oscillator 100 from power dissipation. However, in contrast to the module 120, the trigger switching module 125 may be useful to ensure that the output CK0 from the Schmitt trigger 116 is reset before any subsequent triggering. To that end, when the Schmitt trigger 116 output CK0 has a rising edge, the voltage at CK0 may be pulled to the voltage at SP0, which is pulled down to supply the Schmitt trigger 116 with current. In such examples, Schmitt trigger 116 is triggered and its output, CK0 goes high. The rising edge of CK0 will propagate through the inverter array 118 and CKN goes high. Switch S2 is then turned on by CKN being high and S1 is already on because the delayed output of inverter P7, CKPD, is high as well. The output CKPD is provided by a second delay module which delays the rising of the edge of CKPD by a delay time of $T_{DEL}$. Therefore, the voltage at node SP0 is then pulled to the global positive supply voltage, at the positive supply terminal 127, of the relaxation oscillator 100, with both switches S1 and S2 are on, and Schmitt trigger 116 is reset before the next triggering initiated by the voltage on TOP. Similarly, at the opposite edge of the Schmitt trigger 116, when both CKP and CKND are high, then switches S3 and S4 may be on and pull node SN0 to ground.

The frequency at which the relaxation oscillator 100 operates may be set by and/or based on the input current $I_R$ of the current source 111 and the capacitor value C of the capacitor 114. The starved bias current(s) for the Schmitt trigger 116 and any of the inverters 118 can be set in accordance with $I_R$, or may be set independently of $I_R$.

Figure 4:
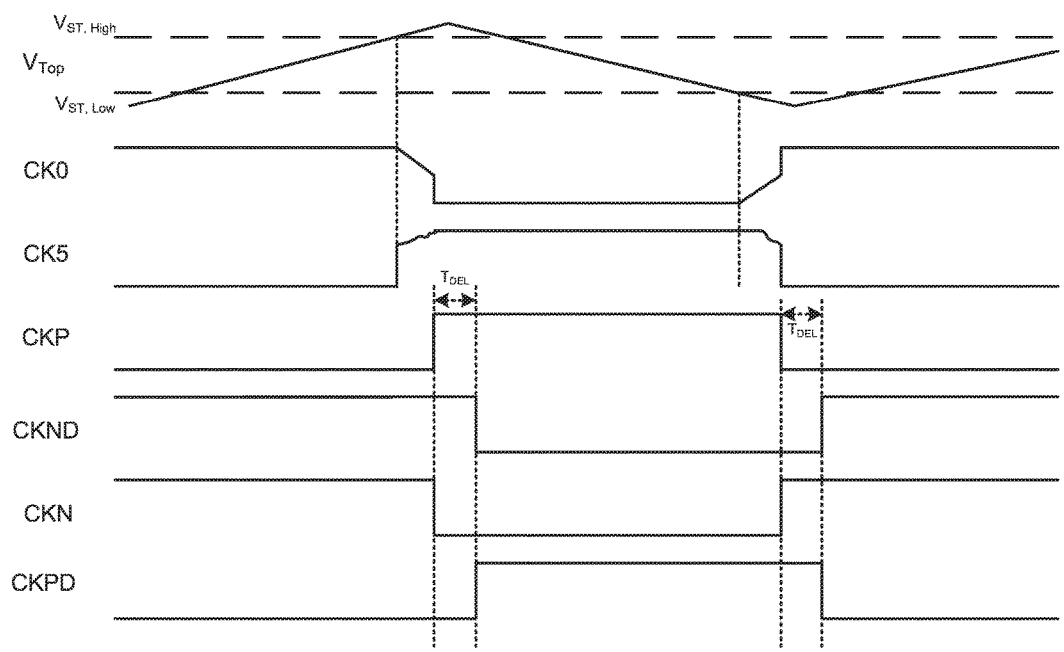
FIG. 4 is a diagrammatic view of a timing diagram of the relaxation oscillator of FIG. 3.

In operation, the current source 111, via the current mirror 105, is constantly either charging or discharging the capacitor 114, in response to current flow changes designated by a switching module 112. For example, consider the voltage at the node TOP ($V_{TOP}$) is below a lower threshold voltage of the Schmitt trigger 116, designated as $V_{ST,LOW}$. In such examples, the output signal of the Schmitt trigger 116, CK0, goes high and the edge from CK0 propagates through the array 18, from inverter P1 through inverter P7, to output the CKP, clocking signal. In such examples, if CKP is low and the switching module 112 turns off S10 and turns on S9 of the switching module 112, which causes the current source 111 to charge C of the capacitor 114 upwards. Alternatively, if $V_{TOP}$ rises above an upper voltage threshold for the Schmitt trigger, $V_{ST,HIGH}$, output of the Schmitt trigger 116, CK0, will go low and, thusly, when inverted by the array 118 with the signal edges propagated throughout, CKP will output high to the switching module 12. In such examples, S9 turns off and S10 turns on, which causes the capacitor 114 to discharge C downwards. This oscillation of the clocking signals and charging/discharging of the capacitor 114 repeats so long as current is supplied to the relaxation oscillator. Graphical depiction of the changes and relationships between $V_{TOP}$, CK0, CK5, CKP, CKND, CKN, and CKPD is illustrated, graphically, in the depiction of signal voltage versus time in FIG. 4.

Figure 5:
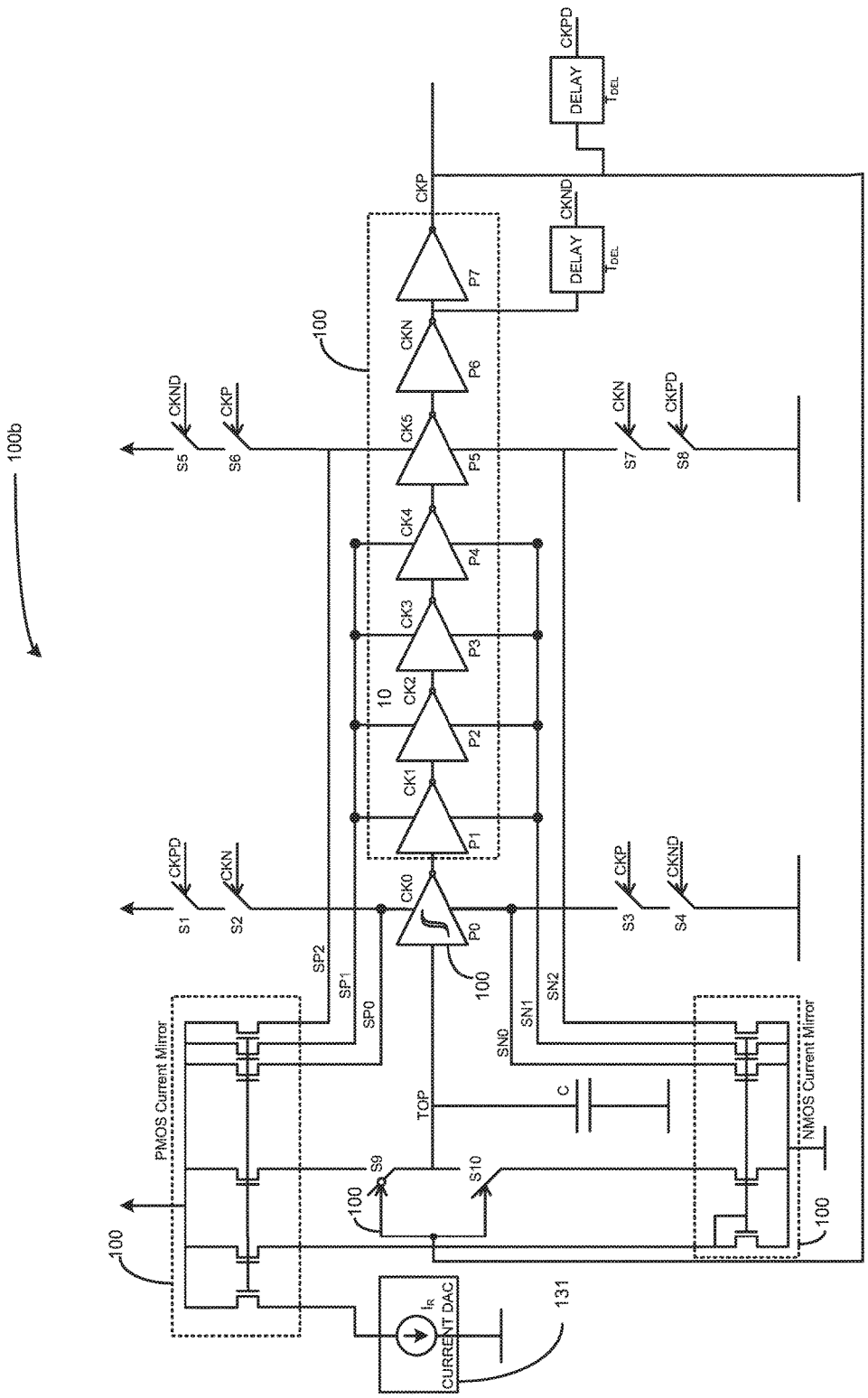
FIG. 5 is another schematic depiction of an alternative implementation of the relaxation oscillator device or circuitry of the present disclosure.
Figure 6:
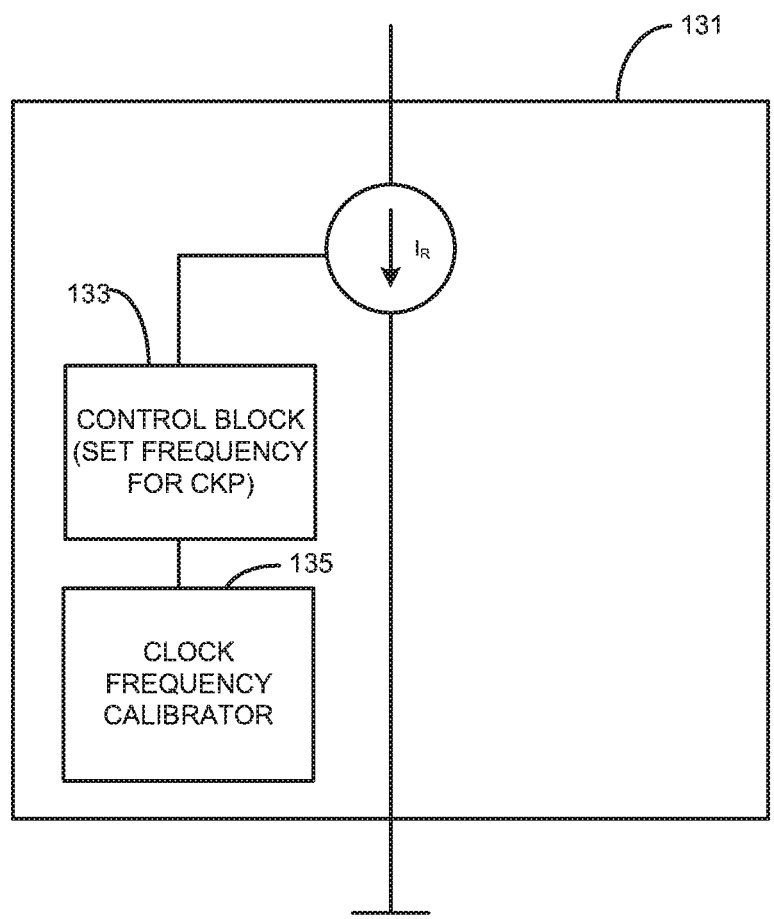
FIG. 6 is a block diagram of an example current DAC of the relaxation oscillator of FIG. 5.

In some examples, such as the example relaxation oscillator 100b of FIG. 5, the current source 111 may be replaced with a current digital-to-analog converter (DAC) 131, while all other elements of the relaxation oscillator 100b remain similar or the same as those of the relaxation oscillator 100 of FIG. 3. The current DAC 131 may be any current DAC known in the art that can be used as a configurable input current source for a relaxation oscillator circuit. As best shown in the block diagram of the current DAC 131 in FIG. 6, the current DAC 131 may have digital input set by a control block 133. The control block 133 may be internal logic of the current DAC 131 or may be outside input to the current DAC 131. The control block 133 may set a clock frequency for the output clock CKP of the relaxation oscillator 100b. Further, in some additional examples, digital input of the DAC may be set by the output of the clock frequency calibrator 135, which may implement a calibration procedure for adjusting the oscillator clock frequency CKP to a target value. Further, output of said calibration procedure may be in response to a difference between the oscillator clock frequency CKP and a reference clock frequency, where the reference clock frequency has a desired, accurate frequency.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A relaxation oscillator circuit comprising:
   a current source configured to provide an input current;
   a current mirror configured to receive the input current from the current source and generate a plurality of starved currents;
   a Schmitt trigger configured to be current starved by a first starved current of the plurality of starved currents and generate a Schmitt trigger output signal in response to an oscillating voltage input, wherein the Schmitt trigger output signal oscillates from a high signal to a low signal, the high signal triggered when the oscillating input voltage is lower than a lower voltage threshold for the Schmitt trigger, and the low signal is triggered when the oscillating input voltage exceeds a high voltage threshold for the Schmitt trigger;
   a plurality of inverters configured to receive the Schmitt trigger output signal and generate an output clock signal based thereon, the plurality of inverters including:
      a plurality of current starved inverters that are current starved by a second starved current of the plurality of starved currents, the plurality of current starved inverters receiving the Schmitt trigger output signal and generating a first inverter output signal; and
      one or more edge shaping inverters configured to further shape edges for the output clock signal and generate the output clock signal based, at least, on the first inverter output signal;
   a capacitor configured to charge or discharge in response to the output clock signal; and
   a switching module configured to provide current from the current source to charge the capacitor when the output clock signal is low and discharge the capacitor when the output clock signal is high.

2. The relaxation oscillator of claim 1, wherein the current mirror includes, at least, a PMOS current mirror and a NMOS current mirror.

3. The relaxation oscillator of claim 2, wherein each of the PMOS current mirror and the NMOS current mirror include a plurality of MOSFET components.

4. The relaxation oscillator of claim 1, wherein the plurality of inverters further includes a final current starved inverter, the final current starved inverter being current starved by a third starved current of the current mirror and configured to receive the first inverter output signal and generate a second inverter output signal based, at least, on the first inverter output signal, and
   wherein the one or more edge shaping inverters generate the output clock signal based on the second inverter output signal.

5. The relaxation oscillator of claim 4, further comprising an inverter switching module operatively associated with the final current starved inverter and configured to insulate the final current starved inverter from voltage shorts via switching based, at least in part, on the output clock signal.

6. The relaxation oscillator of claim 5, further comprising a first delay module configured to delay a falling edge of an inverted clock output signal by a delay time to generate a delayed inverted clock output signal and wherein the delayed inverted clock output signal is utilized by the inverter switching module.

7. The relaxation oscillator of claim 1, further comprising a Schmitt trigger switching module operatively associated with the Schmitt trigger and configured to insulate the Schmitt trigger from voltage shorts via switching based, at least in part, on the output clock signal.

8. The relaxation oscillator of claim 7, further comprising a second delay module configured to delay a falling edge of the clock output signal by a delay time to generate a delayed clock output signal and wherein the delayed clock output signal is utilized by the Schmitt trigger switching module.

9. The relaxation oscillator of claim 1, wherein the capacitor has a capacitance value of C and wherein the current source has a current input value of $I_R$, and wherein a frequency at which the relaxation oscillator oscillates is based, at least in part, on C and $I_R$.

10. The relaxation oscillator of claim 1, wherein the current source is a current digital-to-analog converter (DAC), the current DAC being a configurable input current source.

11. The relaxation oscillator of claim 10, wherein the current DAC includes a control block for setting a digital input for the current DAC.

12. The relaxation oscillator of claim 11, wherein the control block sets a clock frequency for the output clock signal of the relaxation oscillator.

13. The relaxation oscillator of claim 12, wherein the current DAC further includes a clock frequency calibrator which implements a calibration procedure for adjusting the output clock signal to a target value.

14. A relaxation oscillator circuit comprising:
   a current digital-to-analog converter (DAC) configured to provide an input current, the current DAC being a configurable input current source and including a control block for setting a digital input for the current DAC;
   a current mirror configured to receive the input current from the current source and generate a plurality of starved currents;

a Schmitt trigger configured to be current starved by a first starved current of the plurality of starved currents and generate a Schmitt trigger output signal in response to an oscillating voltage input, wherein the Schmitt trigger output signal oscillates from a high signal to a low signal, the high signal triggered when the oscillating input voltage is lower than a lower voltage threshold for the Schmitt trigger, and the low signal is triggered when the oscillating input voltage exceeds a high voltage threshold for the Schmitt trigger;

a plurality of inverters configured to receive the Schmitt trigger output signal and generate an output clock signal based thereon, the plurality of inverters including:

a plurality of current starved inverters that are current starved by a second starved current of the plurality of starved currents, the plurality of current starved inverters receiving the Schmitt trigger output signal and generating a first inverter output signal; and one or more edge shaping inverters configured to further shape edges for the output clock signal and generate the output clock signal based, at least, on the first inverter output signal;

a capacitor configured to charge or discharge in response to the output clock signal; and a switching module configured to provide current from the current source to charge the capacitor when the output clock signal is low and discharge the capacitor when the output clock signal is high.

15. The relaxation oscillator of claim 11, wherein the DAC further includes a clock frequency calibrator which implements a calibration procedure for adjusting the output clock signal to a target value and wherein the control block sets a clock frequency for the output clock signal of the relaxation oscillator based on the calibration procedure.

16. The relaxation oscillator of claim 15, wherein the calibration procedure calibrates the output clock signal in response to a difference between the oscillator clock frequency and a reference clock frequency.

17. A relaxation oscillator circuit for an Internet of Things (IOT) sensor, the relaxation oscillator circuit comprising:

a current source configured to provide an input current;

a current mirror configured to receive the input current from the current source and generate a plurality of starved currents;

a Schmitt trigger configured to be current starved by a first starved current of the plurality of starved currents and generate a Schmitt trigger output signal in response to an oscillating voltage input, wherein the Schmitt trigger output signal oscillates from a high signal to a low signal, the high signal triggered when the oscillating input voltage is lower than a lower voltage threshold for the Schmitt trigger, and the low signal is triggered when the oscillating input voltage exceeds a high voltage threshold for the Schmitt trigger;

a plurality of inverters configured to receive the Schmitt trigger output signal and generate an output clock signal based thereon, the plurality of inverters including:

a plurality of current starved inverters that are current starved by a second starved current of the plurality of starved currents, the plurality of current starved inverters receiving the Schmitt trigger output signal and generating a first inverter output signal;

a final current starved inverter, the final current starved inverter being current starved by a third starved current of the plurality of starved currents and configured to receive the first inverter output signal and generate a second inverter output signal based, at least, on the first inverter output signal; and one or more edge shaping inverters configured to further shape edges for the output clock signal and generate the output clock signal based, at least, on the second inverter output signal;

a capacitor configured to charge or discharge in response to the output clock signal; and a switching module configured to provide current from the current source to charge the capacitor when the output clock signal is low and discharge the capacitor when the output clock signal is high.

18. The relaxation oscillator of claim 17, further comprising an inverter switching module operatively associated with the final current starved inverter and configured to insulate the final current starved inverter from voltage shorts via switching based, at least in part, on the output clock signal.

19. The relaxation oscillator of claim 17, wherein the capacitor has a capacitance value of C and wherein the current source has a current input value of $I_R$, and wherein a frequency at which the relaxation oscillator oscillates is based, at least in part, on C and $I_R$.

20. The relaxation oscillator of claim 17, wherein the current source is a current digital-to-analog converter (DAC), the current DAC being a configurable input current source.

* * * * *